United States Patent
Barsun et al.

(10) Patent No.: US 7,397,666 B2
(45) Date of Patent: Jul. 8, 2008

(54) WEDGE LOCK

(75) Inventors: Stephan K. Barsun, Davis, CA (US); S. Daniel Cromwell, Penryn, CA (US); Bryan D. Bolich, Davis, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 99 days.

(21) Appl. No.: 11/552,963

(22) Filed: Oct. 25, 2006

(65) Prior Publication Data

US 2008/0101031 A1 May 1, 2008

(51) Int. Cl.
 *H05K 7/20* (2006.01)
 *B23P 11/00* (2006.01)

(52) U.S. Cl. .................. 361/719; 361/704; 361/709; 361/710; 361/740; 174/16.3; 174/252; 257/718; 257/719; 257/727; 29/434; 29/469; 29/830; 29/831; 165/80.3; 165/104.33; 165/185; 403/373; 403/374; 403/408.1; 403/409.1

(58) Field of Classification Search ................. 361/687, 361/695–712, 719, 740, 747, 759, 807; 165/80.2, 165/80.3, 80.4, 80.5, 104.33, 104.34, 185; 257/706–727, 684, 686, 730, 740, 741, 797; 174/16.3, 252; 29/434, 469, 830, 831, 832, 29/834; 403/373, 374, 374.1, 374.2, 374.3, 403/408.1, 409.1

See application file for complete search history.

(56) References Cited

U.S. PATENT DOCUMENTS

| | | | | |
|---|---|---|---|---|
| 3,945,743 A | * | 3/1976 | Koch | ............................ 403/290 |
| 4,321,423 A | | 3/1982 | Johnson et al. | |
| 4,403,102 A | | 9/1983 | Jordan et al. | |
| 4,487,300 A | | 12/1984 | Hammond | |
| 4,597,173 A | * | 7/1986 | Chino et al. | ................... 29/741 |
| 4,631,639 A | | 12/1986 | Biraud | |
| 4,665,467 A | | 5/1987 | Speraw et al. | |
| 4,703,567 A | | 11/1987 | Moore et al. | |
| 4,709,302 A | | 11/1987 | Jordan et al. | |
| 4,721,996 A | | 1/1988 | Tustaniwskyj et al. | |
| 4,775,260 A | * | 10/1988 | Kecmer | .................... 403/409.1 |
| 4,824,303 A | * | 4/1989 | Dinger | ......................... 411/79 |
| 4,942,498 A | | 7/1990 | Toussaint | |
| 4,951,176 A | | 8/1990 | Bergfried et al. | |
| 4,953,061 A | | 8/1990 | Nitkiewicz | |
| 5,045,976 A | | 9/1991 | Guilleminot | |
| 5,050,038 A | | 9/1991 | Malaurie et al. | |
| 5,144,535 A | | 9/1992 | Megens et al. | |
| 5,179,506 A | | 1/1993 | Corbett et al. | |
| 5,206,792 A | | 4/1993 | Reynolds | |
| 5,221,811 A | | 6/1993 | Seldin | |
| 5,274,193 A | | 12/1993 | Bailey et al. | |
| 5,276,585 A | | 1/1994 | Smithers | |
| 5,311,395 A | | 5/1994 | McGaha et al. | |
| 5,365,408 A | | 11/1994 | Apitz | |
| 5,379,188 A | | 1/1995 | Winslow | |
| 5,477,420 A | | 12/1995 | Brooks | |
| 5,548,487 A | | 8/1996 | Brabetz et al. | |
| 5,651,688 A | | 7/1997 | Lin | |
| 5,742,844 A | | 4/1998 | Feldman | |
| 5,748,446 A | | 5/1998 | Feightner et al. | |

(Continued)

*Primary Examiner*—Michael V Datskovskiy

(57) ABSTRACT

Various apparatus and methods are disclosed wherein a wedge member and a support engage one another to lock a first structure and a second structure to one another along an axis.

20 Claims, 6 Drawing Sheets

U.S. PATENT DOCUMENTS

| | | | |
|---|---|---|---|
| 5,754,400 A | 5/1998 | Sathe et al. |
| 5,764,485 A | 6/1998 | Lebaschi et al. |
| 5,870,287 A | 2/1999 | Rodriguez et al. |
| 5,886,871 A | 3/1999 | Jeffries et al. |
| 5,896,270 A | 4/1999 | Tsui |
| 5,901,039 A | 5/1999 | Dehaine et al. |
| 5,920,120 A | 7/1999 | Webb et al. |
| 5,928,024 A | 7/1999 | Ming-Huang |
| 5,930,114 A | 7/1999 | Kuzmin et al. |
| 5,940,269 A | 8/1999 | Ko et al. |
| 5,940,279 A | 8/1999 | Gademann et al. |
| 5,958,556 A | 9/1999 | McCutcheon |
| 5,966,289 A | 10/1999 | Hastings et al. |
| 5,986,887 A | 11/1999 | Smith et al. |
| 5,991,154 A | 11/1999 | Clemens et al. |
| 6,023,413 A | 2/2000 | Umezawa |
| 6,055,158 A | 4/2000 | Pavlovic |
| 6,067,231 A | 5/2000 | Lu |
| 6,075,208 A | 6/2000 | Persson |
| 6,075,710 A | 6/2000 | Lau |
| 6,084,781 A | 7/2000 | Klein |
| 6,108,205 A | 8/2000 | Bergstedt |
| 6,125,038 A | 9/2000 | Amaro et al. |
| 6,128,200 A | 10/2000 | Chu |
| 6,144,092 A | 11/2000 | Kappes et al. |
| 6,147,873 A | 11/2000 | Huang |
| 6,169,659 B1 | 1/2001 | Wheaton |
| 6,191,944 B1 | 2/2001 | Hammel et al. |
| 6,208,518 B1 | 3/2001 | Lee |
| 6,215,667 B1 | 4/2001 | Ady et al. |
| 6,229,705 B1 | 5/2001 | Lee |
| 6,233,152 B1 | 5/2001 | Abbott et al. |
| 6,239,974 B1 | 5/2001 | Tseng |
| 6,305,966 B1 | 5/2001 | Arbogast et al. |
| 6,275,380 B1 | 8/2001 | Bollesen |
| 6,278,615 B1 | 8/2001 | Brezina et al. |
| 6,280,116 B1 | 8/2001 | Szu |
| 6,285,554 B1 | 9/2001 | Westburg |
| 6,297,444 B1 | 10/2001 | Chuang et al. |
| 6,301,115 B1 | 10/2001 | Hashimoto et al. |
| 6,304,449 B1 | 10/2001 | Zhang |
| 6,304,453 B1 | 10/2001 | Lo |
| 6,310,771 B1 | 10/2001 | Chien |
| 6,310,779 B1 | 10/2001 | Wang |
| 6,320,748 B1 | 11/2001 | Roden et al. |
| 6,330,908 B1 | 12/2001 | Lee et al. |
| 6,330,996 B1 | 12/2001 | Yo et al. |
| 6,343,016 B1 | 1/2002 | Lin |
| 6,356,445 B1 | 3/2002 | Mochzuki et al. |
| 6,362,978 B1 | 3/2002 | Boe |
| 6,424,537 B1 | 7/2002 | Paquin et al. |
| 6,424,538 B1 | 7/2002 | Paquin |
| 6,426,875 B1 | 7/2002 | Akram et al. |
| 6,428,352 B1 | 8/2002 | Boyden |
| 6,434,007 B1 | 8/2002 | Salmonson et al. |
| 6,452,801 B1 | 9/2002 | Chen |
| 6,456,493 B1 | 9/2002 | Lee |
| 6,459,584 B1 | 10/2002 | Kuo |
| 6,483,704 B2 | 11/2002 | Ulen et al. |
| 6,487,082 B1 | 11/2002 | Carpisi et al. |
| 6,496,372 B1 | 12/2002 | Davison et al. |
| 6,496,374 B1 | 12/2002 | Caldwell |
| 6,501,657 B1 | 12/2002 | Carr |
| 6,501,658 B2 | 12/2002 | Pearson et al. |
| 6,525,938 B1 | 2/2003 | Chen |
| 6,542,368 B2 | 4/2003 | Miyazawa |
| 6,542,369 B1 | 4/2003 | Wu |
| 6,563,213 B1 | 5/2003 | Wong et al. |
| 6,563,712 B2 | 5/2003 | Akram et al. |
| 6,570,763 B1 | 5/2003 | McHugh et al. |
| 6,590,772 B1 | 7/2003 | Ju |
| 6,829,143 B2 * | 12/2004 | Russell et al. | 361/704 |
| 7,031,167 B1 * | 4/2006 | Zagoory et al. | 361/759 |
| 7,197,806 B2 * | 4/2007 | Boudreaux et al. | 29/434 |

* cited by examiner

WEDGE LOCK

BACKGROUND

Processor and heat sink assemblies or modules are sometimes mounted to a circuit board such that a portion is cantilevered above the circuit board. Unless supported, the cantilevered portion may impose a torque on the electrical connection between the processor and the circuit board which may lead to damage of the connection. Existing techniques for supporting the cantilevered portion are complex and may use tools, increasing assembly time and cost.

DETAILED DESCRIPTION OF THE EXAMPLE EMBODIMENTS

Figure 1:
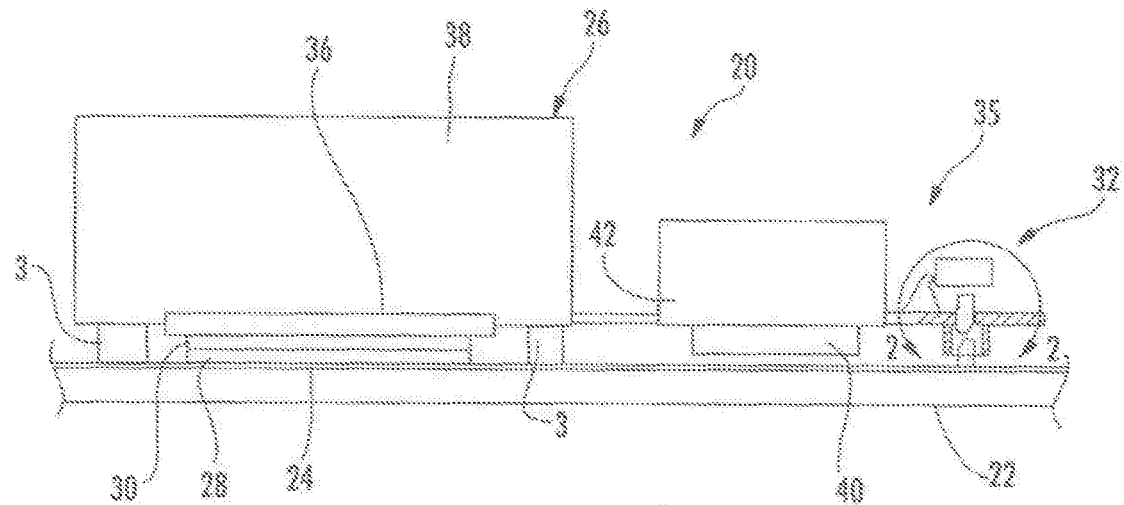
FIG. 1 is a side elevational view schematically illustrating a circuit board assembly, with portions shown in section, according to an example embodiment.

FIG. 1 is a side elevational view schematically illustrating circuit board assembly 20. Circuit board assembly 20 generally includes circuit board 22, frame 24, electronic component 26, connector 28, connector 30 and electronic component wedge lock system 32. Circuit board 22 comprises a conventionally known or future developed circuit board configured to transmit signals to and from various components connected to circuit board 22. Such components may be permanently secured to circuit board 22, such as resistors, capacitors and the like. Other components may be releasably connected to circuit board 22.

Frame 24 comprises a generally rigid structure extending adjacent circuit board 22. Frame 24 rigidifies and supports circuit board 22. In the example illustrates how frame 24 further serves as an enclosure or chassis for partially surrounding other components of circuit board assembly 20. Frame 24 further supports portions of support system 32. In alternative embodiments, frame 24 may be omitted wherein wedge lock system 32 directly interacts with circuit board 22 or to other structures mounted to circuit board 22.

Electronic component 26 comprises an electronic component of device configured to be releasably connected to circuit board 22 by mounts 31. Mounts 31 support component 26 above circuit board 22 while connectors 28 and 30 are interconnected. Mounts 31 extend proximate to connectors 28 and 30 to facilitate proper connection between connectors 28 and 30. As shown by FIG. 1, this may result in portions 35 of component 26 being cantilevered or suspended above circuit board 22. Unless supported, cantilevered portion 35 may impose a torque upon the connection between component 26 and circuit board 22. As will be described hereafter, wedge lock system 32 assists in supporting cantilevered portion 35.

In the example illustrated, electronic component 26 comprises a processor-heatsink assembly or module which includes processor 36, heatsink 38, power regulator 40 and heatsink 42 (each of which is schematically shown). Processor 36 comprises a device configured to manipulate electrical or digital signals and includes a processor board supporting a processor chip (not shown). Heatsink 38 is thermally coupled to processor 36 and is configured to dissipate heat generated by processor 36. Power regulator 40, also known as a voltage regulator or power pod, regulates voltage supplied to processor 36 and is electrically connected to processor 36. Heatsink 42 is thermally coupled to voltage regulator 40 and is configured to dissipate heat produced by voltage regulator 40. As shown by FIG. 1, voltage regulator 40 and heatsink 42 are cantilevered above circuit board 22 by mounts 31.

Connectors 28 and 30 engage and connect with one another to connect electronic component 26 to circuit board 22 so as to transmit signals to and from electronic component 26 and circuit board 22. In one embodiment, connector 28 may include a plurality of sockets, while connector 30 includes a plurality of pins configured to be received within the plurality of sockets. In yet another embodiment, connector 28 may include a plurality of sockets, while connector 30 includes a plurality of pins. In still other embodiments, connectors 28 and 30 may comprise other conventionally known or future developed devices for connecting electronic component 26 to circuit board 22 and for transmitting signals in at least one direction between electronic component 26 and circuit board 22.

Wedge lock system 32 supports or assists in supporting and retaining electronic component 26 relative to circuit board 22 to control the spacing between cantilevered portion 35 of electronic component 26 and circuit board 22. As a result, wedge lock system 32 assists in appropriately supporting connectors 28 and 30 relative to one another. Wedge lock system 32 is configured to be actuated without additional tools or with reduced reliance upon additional tools to simplify assembly and use.

Figure 2:
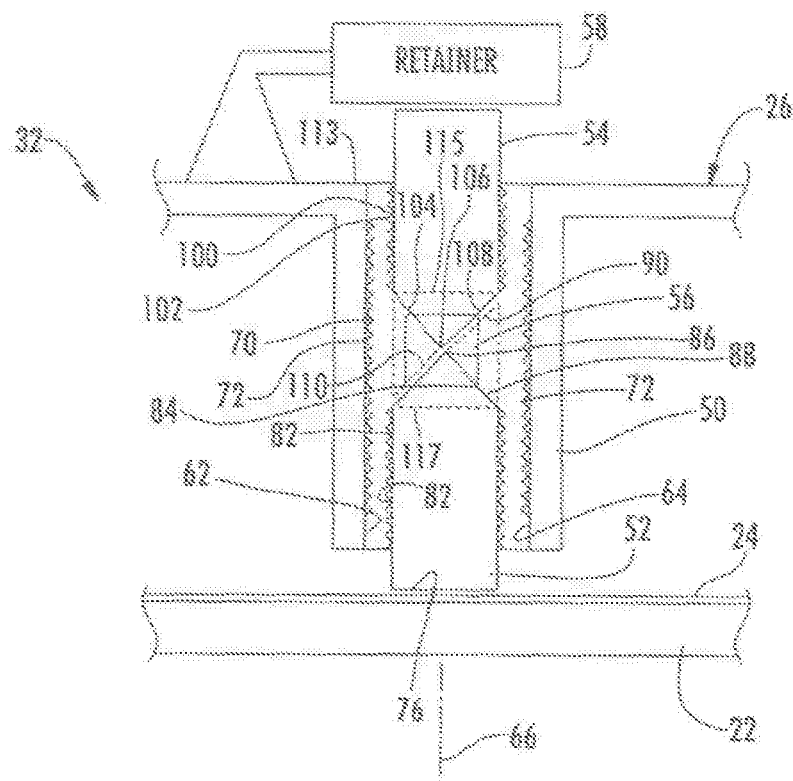
FIG. 2 is an enlarged fragmentary sectional view of the assembly of FIG. 1 taken along line 2-2 illustrating the wedge lock system in an unlocked state according to an example embodiment.
Figure 3:
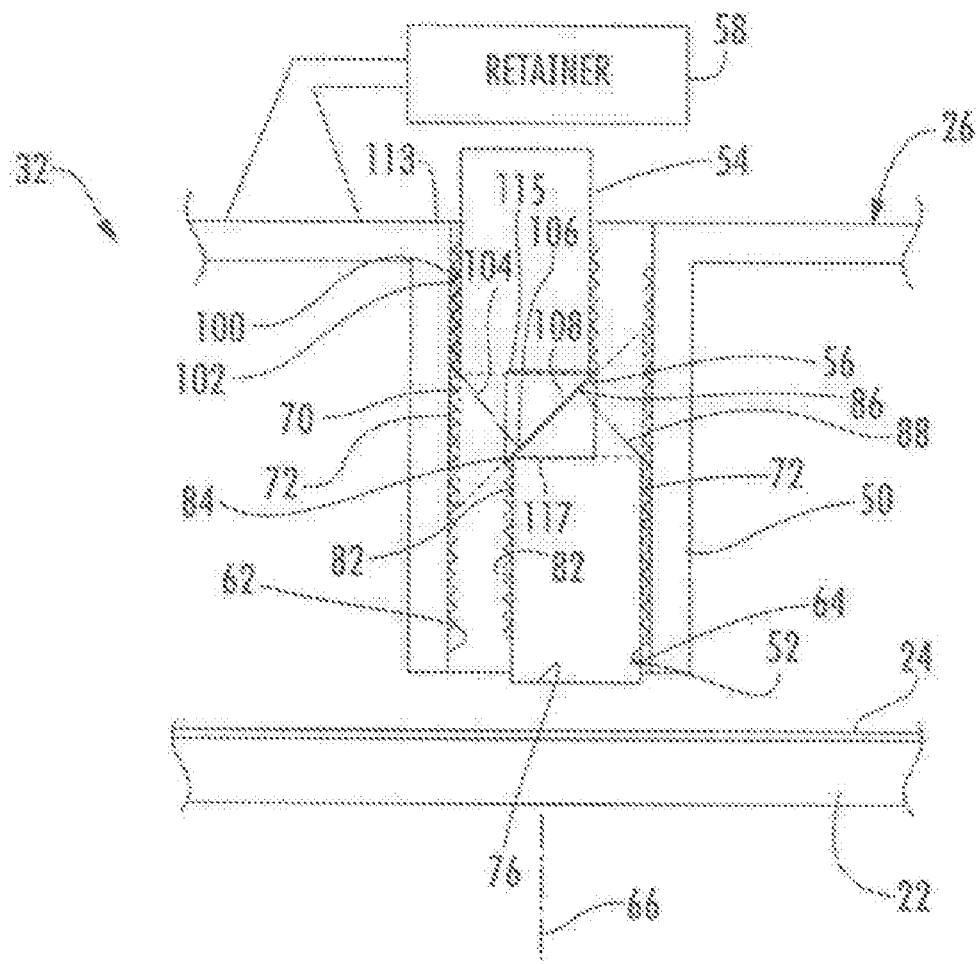
FIG. 3 is an enlarged fragmentary sectional view of the assembly of Figure will 1 taken along line 2-2 illustrating the wedge lock system in a locked state according to an example embodiment.

FIG. 2 illustrates wedge lock system 32 in more detail. As shown by FIG. 2, wedge lock system 32 includes wedge body 50, support 52, wedge member 54, bias 56 and retainer 58. Wedge body 50 comprises a structure having opposite mutually facing sides 62, 64 extending along axis 66. Body 50 is coupled to component 26 such that body 50 is immovable along axis 66 relative to component 26. For purposes of this disclosure, the term "coupled" shall mean the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. The term "thermal coupling" shall mean that two elements are configured to transmit heat therebetween either directly or across intermediate structures or materials having relatively high degrees of thermal conductivity.

In the particular embodiment illustrated, body 50 is physically coupled to component 26 so as to move with the component 26. According to one embodiment, body 50 comprises a tubular structure having internal sides that continuously extend about axis 66. In other embodiments, body 50 may comprise multiple spaced arcuate or planar sides along axis 66. In one embodiment, body 50 is integrally formed as part of a single unitary body with at least a portion of component 26. In yet other embodiments, body 50 may be welded, bonded, glued, crimped, press fit or otherwise attached to one or more structures of component 26. Although body 50 is illustrated as having a circular outer cross-section, in other embodiment, body 50 may have other outer configurations.

As further shown by FIG. 2, body 50 is configured to removably receive support 52 and wedge member 54. In particular, body 50 is configured to receive support 52 as support 52 and wedge member 54 are moved towards one another along axis 66. In one embodiment, body 50 is configured to permit support 52 and wedge member 54 to linearly move along axis 66 within body 50 without being rotated.

To facilitate wedging of support 52 to body 50, body 50 includes a series of projections 70 and a series of detents 72 extending along axis 66. Projections 70 comprise bumps, points, teeth, protuberances and the like extending outward from an interior of body 50 in a direction nonparallel to axis 66. Projections 70 are configured to be received within corresponding detents of support 52 while detents 72 are configured to receive corresponding projections of support 52. In one embodiment, projections 70 and detents 72 and may be provided by knurling or threading of an interior circumferential surface of body 50 such that projections 70 and detents 72 substantially helically extend about axis 66. In other embodiments, projections 70 and detents 72 may be formed on one or more sides of axis 66, such as on sides 62 and 64.

Detents 72 comprise indents, depressions, grooves, or voids extending in a direction nonparallel to axis 66. In one embodiment, detents 72 may be formed between consecutive projections 70. In other embodiments, detents 72 may be formed into body 50 separate from any projections.

Support 52 comprises a structure extending from frame 24 (or circuit board 22 in some embodiments) extending into body 50. In the particular example illustrated, support 52 has a lower surface 76 which rests upon frame 24 (or upon circuit board 22 when frame 24 is omitted). In other embodiments, surface 76 may rest upon frame 24 within an alignment slot or channel (not shown) which guides transverse movement of support 52. Support 52 extends into body 50 along axis 66 and is movable in a direction transverse or perpendicular to axis 66 while within body 50 prior to being wedged against body 50.

To facilitate wedging of support 52 to body 50, support 52 includes a series of external projections 80 and detents 82, and tip 84. Projections 80 comprise bumps, points, teeth, protuberances and the like extending outward from an exterior of support 52 in a direction nonparallel to axis 66. Projections 80 are configured to be received within corresponding detents of body 50 while detents 82 are configured to receive corresponding projections of body 50.

Detents 82 comprise indents, depressions or voids extending in a direction nonparallel to axis 66. The series of projections and detents extends along axis 66. In one embodiment, detents 82 are formed between consecutive projections 80. In other embodiments, detents 82 are formed within the body of support 52 separate from projections 80. In one embodiment, projections 80 and detents 82 may be provided by knurling or threading of an exterior circumferential surface of support 52 such that projections 80 and detents 82 extend about axis 66. In other embodiments, projections 80 and detents 82 may be formed on one or more sides of axis 66.

Tip 84 comprises that portion of support 52 at an axial end of support 52 substantially facing in a direction parallel to axis 66. Tip 84 is configured to slide against wedge member 54 during movement of wedge member 54 along axis 66 so as to move (slide or pivot) support 52 in a sideways direction towards body 50. In one embodiment, tip 84 includes an axial point 86 surrounded by one or more tapering sides 88. For example, side 88 may be planar or side 88 may be curved or arcuate such that tip 84 is cone-shaped. In another embodiment, tip 84 may include a single beveled or tapered surface 90 as indicated with broken lines. In such an embodiment, surface 90 dictates one side within body 50 where projections 80 and/or detents 82 interlock with corresponding detents 72 and/or projections 72 or body 50 upon movement of wedge member 54 towards support 52. Sides 88 or side 90 facilitate sideways movement (sliding and/or pivoting) of support 52 when wedge member 54 is urged against an axial end portion of support 52 as will be described hereafter.

Wedge member 54 comprises a structure configured move (slide or pivot) support 52 in a direction nonparallel to axis 66 to move support 52 from a disengaged position in which projections 80 and detents 82 are out of engagement with projections 70 and detents 72 to an engaged or locked position or state in which projections 70 and detents 72 interlock with detents 82 and projections 80, respectively. Wedge member 54 includes one or more series of projections 100 and detents 102, and tip 104.

Projections 100 comprise bumps, points, teeth, protuberances and the like extending outward from an interior of body 50 in a direction nonparallel to axis 66. Projections 100 are configured to be received within corresponding detents 72 of support 52 while detents 102 are configured to receive corresponding projections 70 of support 52.

Detents 102 comprise indents, depressions, grooves, or voids extending in a direction nonparallel to axis 66. In one embodiment, detents 102 may be formed between consecutive projections 100. In other embodiments, detents 102 may be formed into body 50 separate from any projections. As will be described hereafter, projections 100 and detents 102 assist to securing wedge member 54 against axial movement along axis 66 once wedge member 54 has been wedged against body 50 as a result of engagement with tip 84 of support 52. In one embodiment, projections 100 and detents 102 may be provided by knurling or threading of an interior circumferential surface of body 50 such that projections 100 and detents 102 continuously helically extend about axis 66. In other embodiments, projections 100 and detents 102 may be formed on one or more sides of wedge member 54. In other embodiments, wedge member 54 may omit detents 102 and projections 100.

Tip 104 of wedge member 54 facilitates sideways, transverses or lateral movement of wedge member 54 and support 52 relative to one another. In the example illustrated, tip 104 of wedge member 54 engages tip 84 of support 52 and causes support 52 to move sideways towards body 50. At the same time, wedge member 54 moves (slides and/or pivots) in an opposite sideways direction to bring projections 100 and detents 102 into interlocking engagement with detents 72 and projections 70, respectively, of body 50, further securing wedge member 54 against movement along axis 66 when experiencing vibration or shock.

In the example illustrated, tip 104 includes an axial point 106 surrounded by one or more tapering sides 108. For example, side 108 may be planar or side 108 may be curved or arcuate such that tip 104 is cone-shaped. In another embodiment, tip 104 may include a single beveled or tapered surface 110 extending across an axial centerline of member 54 as indicated with broken lines. In such an embodiment, surface 110 dictates one side within body 50 where projections 80 and detents 82 of support 52 and where projections 100 and detents 102 if wedge member 54 interlock with corresponding projections 70 and detents 72 of body 50 upon movement of wedge member 54 against tip 84 support 52.

Bias 56 comprises one or more resilient structures arranged and configured so as to resiliently urge which a member 54 away from support 52. Bias 56 reduces the likelihood of premature engagement of wedge member 54 with support 52 which may otherwise result in support 52 being prematurely moved to the locked position. In the example illustrated, bias 56 comprises a coil or compression spring captured between wedge member 54 and support 52 within body 50. In those embodiments in which tips 84 and 104 include points 88 and 106 and in which bias 56 comprises a compression spring, bias 56 also serves to assist in more centrally locating support 52 and wedge member 54 with in body 50 along axis 66 prior to compression of bias 56. In other embodiments, bias 56 may have other configurations. For example, in other embodiments, wedge member 54 may include a head capturing bias 56, comprising a compression spring or other resilient mechanism, between the head and surface 113. In still other embodiments, bias 56 may be omitted.

Retainer 58 comprises a mechanism configured to releasable secure wedge member 54 in engagement with support 52 and maintain support 52 in a locked state. In one embodiment, retainer 58 is further configured to apply force to wedge member 54 to move wedge member 54 along axis 66 and against bias 56 to move a support 52 from the disengaged state to the locked state. According to one embodiment, retainer 58 may comprise a lever and latch pivotably connected to a frame or chassis of assembly 20 or to component 26. In such an embodiment, pivoting of the lever would result in one more structures applying forced to which a member 54 to move wedge member 54 along axis 66 towards circuit board 22 to support 52 into a locked state with body 50. Latching of the lever to the frame or chassis of assembly 20 retains with a member 54 in the engaged state with support 52 and maintains compression of bias 56. In one embodiment, retainer 58 may additionally include a resiliently biased plunger carried by the lever, wherein pivoting of the lever lowers the plunger into engagement with wedge member 54 so as to exert a force upon wedge member 54 to move wedge member 54 along axis 66. In other embodiments, retainer 58 may have various other configurations or may be omitted.

In operation, to assemble electronic components 26 to circuit board 22, connectors 28 and 30 (shown in FIG. 1) are brought into connection with one another and mounts 31 are secured to frame 24 (or another stationary structure associated with assembly 20). Support 52 is aligned and located within body 50. As component 26 is moved towards circuit board 22 during securement of mounts 31 and connection of connectors 28 and 30, body 50 is lowered along axis 66 about support 52. Thereafter, wedge member 54 is forced along axis 66 and against bias 56 through body 50 and into engagement with support 52. During such engagement, one or more surfaces of tips 84 and 104 that are oblique to axis 66 interact to cause sideways movement of wedge member 54 and support 52 until projections 80 and detents 82 of support 52 interlock with projections 70 and detents 72 of body 50 and projections 100 and detents 102 interlock with projections 70 and detents 72 of body 50. When in this locked state, the projections mate or fit within detents so as to engage both an upper and a lower surface of a receiving detent to secure and retain electronic component 26 relative to circuit board 22 in both directions along axis 66. Retainer 58 maintains this locked state. As a result, cantilevered portion 35 is stabilized during periods of shock or vibration, reducing torque imposed upon the connection between connectors 28 and 30.

FIG. 2 illustrates one example of wedge lock system 32. In other embodiments, wedge lock system 32 may have other configurations. For example, in lieu of body 50, support 52 and wedge member 54 each having a series of projections and detents, in other embodiments, body 50 may have a series of projections and detents along axis 66 while support 52 and wedge member 54 each have only a single projection or detent. As noted above, in some embodiments, wedge member 54 may omit any projections are detents. In yet other embodiments, support 52 and wedge member 54 may include a series of projections and detents while the interior of body 50 includes a single projection or a single detent. In those embodiments in which support 52 includes surface 90, wedge member 54 may alternatively include an end surface 115 (shown in broken lines) substantially perpendicular to axis 66. In those embodiments in which wedge member 54 includes surface 110, support 52 may include an end surface 117 substantially perpendicular to axis 66. Although support 52 has been described as being movable in a sideways direction transverse to axis 66 so as to move from a disengaged state to a locked state or position, in other embodiments, support 52 may be fixed or held against transverse movement with respect to axis 66 where body 50 is alternatively movable or slidable in a transverse direction with respect to axis 66 and with respect to support 52 while moving in substantial unison along axis 66 with cantilevered portion 35 of component 26.

FIGS. 3-6 illustrate circuit board assembly 220, another embodiment of circuit board assembly 20. Circuit board assembly 220 includes, amongst other elements, circuit board 222, chassis or frame 224, electronic components 226, connectors 28, 30 (shown in FIG. 1), mounts 31 (shown in FIG. 1) and wedge lock systems 232. Circuit board 222 comprises a presently known or future developed circuit board configured to transmit signals to and from various components connected to circuit board 22. Such components may be permanently secured to circuit board 222, such as resistors, capacitors and the like. Other components may be releasably connected to circuit board 222.

Frame 224 comprises a generally rigid structure extending adjacent circuit board 222. Frame 224 rigidifies and supports frame 224. Frame 224 further supports portions of wedge lock system 232. In alternative embodiments, frame 224 may be omitted wherein wedge lock system 232 directly interacts with circuit board 222 or to other structure mounted to circuit board 222.

Figure 4:
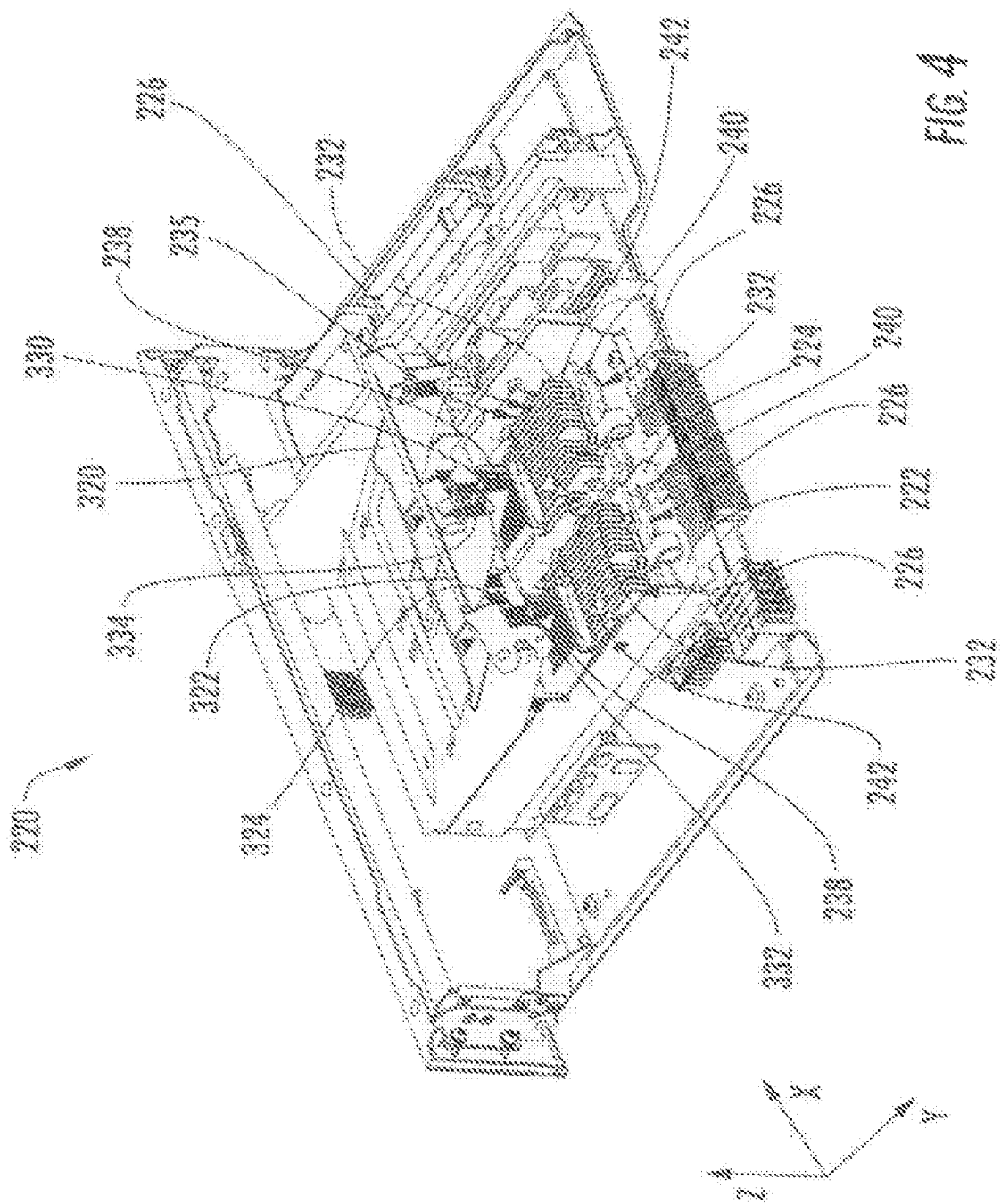
FIG. 4 is a top perspective view of another embodiment of the circuit board assembly of FIG. 1 illustrating another embodiment of the wedge lock system in an unlocked state according to an example embodiment.

Each electronic component 226 comprises an electronic component or device configured to be releasably connected to circuit board 222 by mounts 31. Mounts 31 support component 226 above circuit board 22 while connectors 28 and 30 (shown in FIG. 1) are interconnected. Mounts 31 extend proximate to connectors 28 and 30 to facilitate proper connection between connectors 28 and 30. As shown by FIG. 4, this may result in portions 235 of component 226 being cantilevered or suspended above circuit board 222. Unless supported, cantilevered portion 235 may impose a torque upon the connection between component 226 and circuit board 222. Wedge lock system 232 assists in supporting cantilevered portion 235.

In the example illustrated, electronic component 226 comprises a processor-heatsink assembly or module which includes processor 36 (shown in FIG. 1), heatsink 238, power regulator 240 and heatsink 242. As discussed above with respect to FIG. 1, processor 36 comprises a device configured to manipulate electrical or digital signals and includes a processor board supporting a processor chip (not shown). Heatsink 238 is thermally coupled to processor 36 and is configured to dissipate heat generated by processor 36. Power regulator 240, also known as a voltage regulator or power pod, regulates voltages supplied to processor 36 and is electrically connected to processor 36 (shown in FIG. 1). Heatsink 242 is thermally coupled to power regulator 240 and is configured to dissipate heat produced by power regulator 240. As shown by FIG. 4, power regulator 240 and heatsink 242 are cantilevered above circuit board 222.

Figure 6:
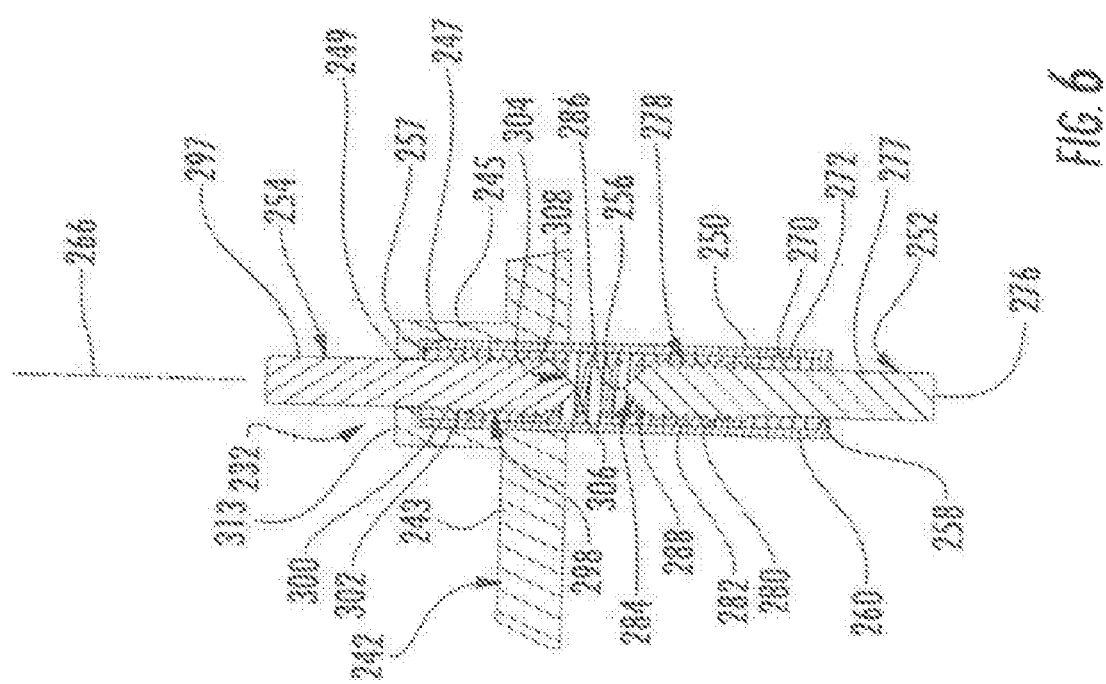
FIG. 6 is a fragmentary sectional view of the wedge lock system of FIG. 4 according to an example embodiment.

As shown by FIG. 6, heatsink 242 includes an extension 243 having a boss 245. Boss 245 has an internal bore 247 and an axial opening 249. As will be described in detail hereafter, bore 247 and opening 249 facilitate securement of wedge lock system 232 to heatsink 242 and component 226.

Connectors 28 and 30 (shown in FIG. 1) engage and connect with one another to connect electronic component 226 to circuit board 222 so as to transmit signals to and from electronic component 226 and circuit board 222. In one embodiment, connector 28 may include a plurality of sockets, while connector 30 includes a plurality of pins configured to be received within the plurality of sockets. In yet another embodiment, connector 28 may include a plurality of sockets, while connector 30 includes a plurality of pins. In still other embodiments, connectors 28 and 30 may comprise other conventionally known or future developed devices for connecting electronic component 226 to circuit board 222 and for transmitting signals in at least one direction between electronic component 226 and circuit board 222.

Wedge lock system 232 supports or assists in supporting and retaining electron component 226 relative to circuit board 222 to control the spacing between electronic component 226 and circuit board 222. As a result, wedge lock system 232 assists in appropriately supporting connectors 28 and 30 relative to one another. Wedge lock system 232 is configured to be actuated without additional tools or with reduced reliance upon additional tools to simplify assembly and use.

Figure 5:
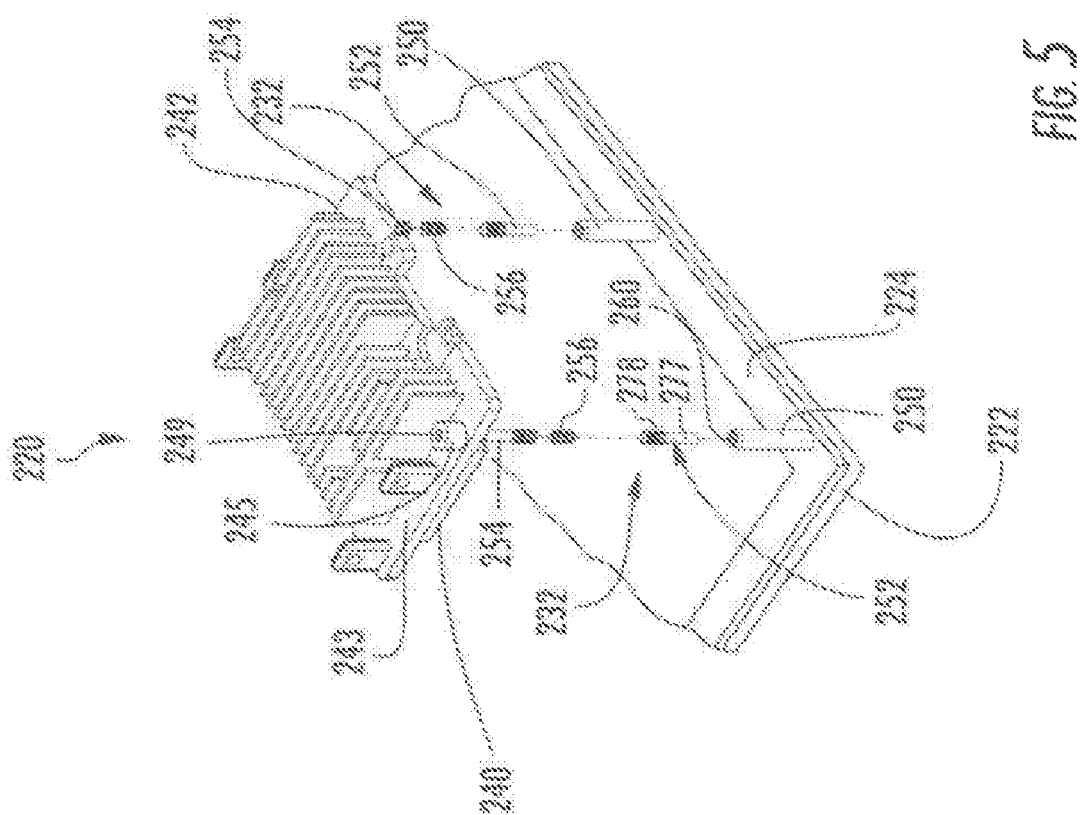
FIG. 5 is an exploded fragmentary perspective view of a portion the wedge lock system of FIG. 4 according to an example embodiment.
Figure 7:
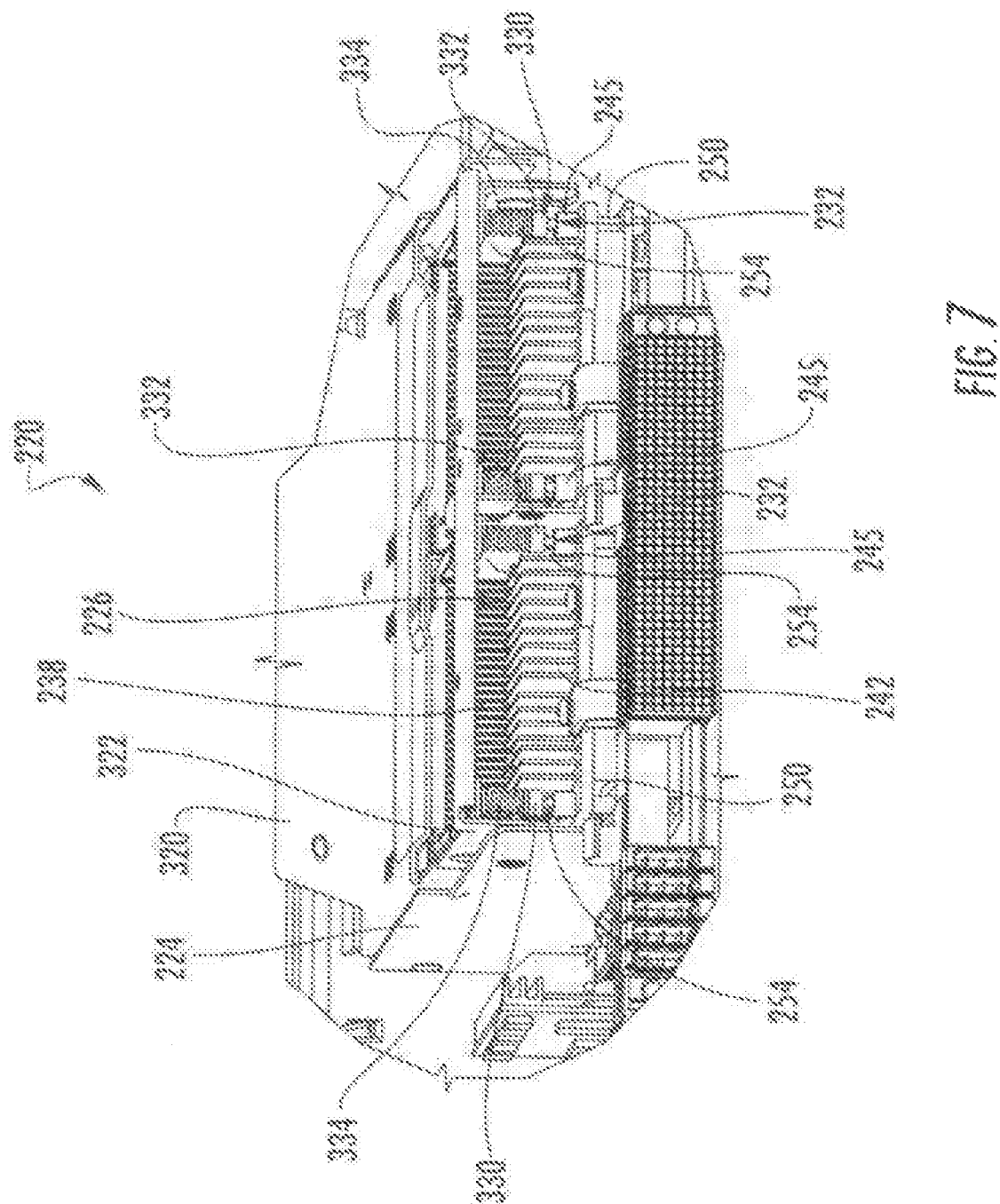
FIG. 7 is a top perspective view of the circuit board assembly of FIG. 1 illustrating the wedge lock system in a locked state according to an example embodiment.

FIGS. 5 and 6 illustrate wedge lock system 232 in more detail. As shown by FIG. 5, wedge lock system 232 includes wedge body 250, support 252, wedge member 254, bias 256 and retainer 58 (shown in FIGS. 4 and 7). As shown by FIG. 6, wedge body 250 comprises an elongate tube or sleeve configured to receive support 252, wedge member 254 and bias 256. Body 250 includes opposite axial openings 257, 258 and an intermediate internal bore 260 extending along axis 266. Opening 257 is sized for the reception of support 252, wedge member 254 and bias 256. Opening 257 is located at an end of body 250 which is press fit within bore 247 such that opening 257 extends opposite to opening 249. Opening 258 extends opposite to opening 257 and has reduced size so as to capture a portion of support 252 within bore 260. Bore 260 extends between openings 257 and 258 along axis 266 and provides a series of projections 270 and detents 272 along axis 266. In the example illustrated, bore 260 is internally threaded to provide projections 270 and detents 272. In other embodiments, bore 260 may alternatively be knurled.

Support 252 comprises a structure configured to rest upon frame 224 (or circuit board 222 in some embodiments). In the particular example illustrated, support 252 has a lower surface 276 which rests upon frame 224 (or upon circuit board 222 when frame 224 is omitted). Support 252 extends into body 250 along axis 266 and is movable in a direction transverse or perpendicular to axis 266 while within body 250 prior to being wedged against body 250.

As shown by FIG. 6, support 252 includes shaft portion 277 and engagement portion 278. Shaft portion 277 extends from engagement portion 278 and has a reduced outer diameter as compared to engagement portion 278. Shaft portion 277 is configured to freely pass through opening 258 to permit body 250 and support 252 to slide along shaft portion 277 along axis 266 when support 252 is not locked to body 250. Shaft portion 277 is sufficiently smaller than opening 258 such that engagement portion 278 may either slide in a transverse direction or pivot with opening 258 to move in a transverse direction into and out of engagement with body 250.

Engagement portion 278 is configured to be selectively engaged or interlocked with projections 270 and detents 272 of body 250. Engagement portion 278 includes a series of external projections 280 and detents 282, and tip 284. In the embodiment illustrated, projections 280 and detents 282 are provided by knurling or threading of an exterior circumferential surface of engagement portion 278 of support 252 such that projections 280 and detents 282 extend about axis 266. In other embodiments, projections 280 and detents 282 may be formed to in other fashions along an exterior of engagement portion 278.

As further shown by FIG. 6, engagement portions 278 has a larger outer diameter as compared to shaft portion 277. Engagement portion 278 has an outer diameter larger than opening 258, capturing engagement portion 278 within bore 260 of body 250. As will be later described, the capturing of engagement portion 278 facilitates assembly.

Tip 284 comprises that portion of support 52 at an axial end of support 252 substantially facing in a direction parallel to axis 266. Tip 284 is configured to slide against wedge member 254 during movement of wedge member 54 along axis 266 so as to move support 252 in a sideways direction towards body 250. In the particular example illustrated, tip 284 includes an axial point 286 surrounded by one or more tapering sides 288. For example, side 288 may be planar of side 288 may be curved or arcuate such a tip 284 is cone-shaped. In another embodiment, tip 284 may include a single beveled or tapered surface. Sides 288 facilitate sideways movement of pivoting of engagement portion 278 of support 252 when wedge member 254 is urged against an axial end portion of support 252 as will be described hereafter.

Wedge member 254 comprises a structure configured to move (slide or pivot) support 252 in a direction nonparallel to axis 266 to move engagement portion 278 of support 252 from a disengaged position in which detents 280 and projections 282 are not of engagement with projections 270 and detents 272 to an engaged or locked position in which projections 270 and detents 272 interlock with detents 282 and projections 280, respectively. Wedge member 254 includes shaft portion 297 and engagement portion 298. Shaft portion 297 extends from engagement portion 279 and has a reduced outer diameter as compared to engagement portion 298. Shaft portion 297 is configured to freely pass through openings 257 and 249 to permit member 254 to slide within body 250 along axis 266 when wedge member 254 is not locked to body 250. Shaft portion 297 is sufficiently smaller than opening 249 such that engagement portion 298 may either slide in a transverse direction or pivot with an opening 249 to move in a transverse direction into and out of engagement with body 250.

Engagement portion 298 is configured to be selectively engaged or interlocked with projections 270 and detents 272 of body 250. Engagement portion 278 includes a series of external projections 300 and detents 302, and tip 304. In the embodiment illustrated, detents 302 and projections 300 are provided by knurling or threading of an exterior circumferential surface of engagement portion 298 of wedge member 254 such that projections 300 and detents 302 extend about axis 266. In other embodiments, projections 300 and detents 302 may be formed in other fashions along an exterior of engagement portion 298.

As further shown by FIG. 6, engagement portion 298 has a larger outer diameter as compared to shaft portion 297. Engagement portion 298 has an outer diameter larger than opening 249, capturing engagement portion 298 within bore 260 of body 259. As will be later described, the capturing of engagement portion 298 facilitates assembly.

Tip 304 comprises that portion of wedge member 254 at an axial end of member 254 substantially facing in a direction parallel to axis 266. Tip reserved for is configured to slide against tip 284 during movement of wedge member 254 along axis 266 so as to move (by transverse sliding or pivoting) support 252 in a sideways direction towards body 250. In the particular example illustrated, tip 284 includes an axial point 306 surrounded by one or more tapering sides 308. For example, side 208 may be planar or side 208 may be curved or arcuate such a tip 304 is cone-shaped. In another embodiment, tip 304 may include a single beveled or tapered surface. Sides 308 facilitate sideways movement or pivoting of engagement portion 298 of member 254 when wedge member 254 is urged against support 252 as will be described hereafter. Because wedge member 254 and support 252 are identical to one another, wedge locks system 232 has fewer parts and may be less complex and expensive. In other embodiments, member 254 and support 252 may be differently configured from one another.

Bias 256 comprises one or more resilient structures arranged and configured so as to resiliently urge wedge member 254 away from support 252. Bias 256 reduces the likelihood of premature engagement of wedge member 254 with support 252 which may otherwise result in support 252 being prematurely moved to the locked position. In the example illustrated, bias 256 comprises a coil or compression spring captured between wedge member 254 and support 252 within body 250. In those embodiments in which tips 284 and 304 include points 286 and 306 and in which bias 256 comprises a compression spring, bias 256 also serves to assist in more centrally locating support 252 and wedge member 254 within body 250 along axis 266 prior to compression of bias 256. In other embodiments, bias 256 may have other configurations. For example, in other embodiments, wedge member 254 may include a head capturing bias 256, comprising a compression spring or other resilient mechanism, between the head and surface 313. In still other embodiments, bias 256 may be omitted.

As mentioned above, the particular arrangement of wedge lock system 232 facilitates assembly. To assemble wedge lock system 232, support 252 is inserted into bore 260 of body 250. Due to the small diameter of opening 258 as compared to the diameter of engagement portion 278, support 252 is partially captured within bore 260. Bias 256 is subsequently inserted through opening 257 of body 250 such that biased to 56 rests upon tip 284 of support 252. Thereafter, wedge member 254 is inserted through opening 257 of body 250 such that tip 304 rests upon bias 256 within bore 260. Once wedge member 254 has been inserted into body 250, body 250 is press fit into bore 247 of boss 245 with shaft portion 297 passing through opening 249 of boss 245. As a result, support 252 and wedge member 254 are both captured within body 250 with biased to 56 captured between support 252 and wedge member 254. Wedge lock system 232 is then ready for being actuated to support electronic component 226 relative to circuit board 222 (shown in FIG. 5) along axis 266.

Retainer 258 (shown in FIG. 4) is configured to actuate wedge lock system 232 to a locked state and to retain system 232 in the locked state. As shown by FIG. 4, retainer 258 includes lever 320, latch 322 and plungers 324. Lever 320 comprises an arrangement of one more rigid members movably coupled to frame 224 and carrying plungers 324. Lever 320 moves between an open state (shown in FIG. 4 and a closed state (shown in FIG. 7). In the particular example illustrated, lever 320 acts as a clam shell by pivoting between the open state and the closed state over and above electronic components 226. In the particular example illustrated, lever 320 is additionally configured to exert a load upon electronic components 226 to clamp components 226 in proper connection with circuit board 222. In other embodiments, lever 320 may have other purposes as well.

Latch 322 comprises a mechanism coupled to lever 320 and configured to secure and retain lever 320 the closed state. In the particular example illustrated, latch 322 comprises a hook-like member pivotally coupled to lever 320 and configured hook about about a corresponding structure associated with frame 24 or another stationary structure. In other embodiments, latch 322 may have other configurations for releasably retaining lever 329 in a closed state.

Plungers 324 are configured to engage and move wedge member 254 against the force of biases 256 into engagement with supports 252 to move supports 252 to their locked position. Plungers 324 further retain wedge member 254 in engagement with supports 252 and retain supports 252 in their locked states while lever 320 is in the closed state. Each plunger 324 includes an axially movable pin or bolt 330 carried by lever 320 and having a head 332. Head 332 captures a compression spring 334 between head 332 and a supporting portion of lever 320. Springs 334 resiliently bias heads 332 to extended positions towards circuit board 222. As lever 320 is lowered to the closed position shown in FIG. 7, heads 332 are brought into contact with wedge members 354 to move wedge members 354 downward against biases 256 and into engagement with supports 252. As result, engagement portions 278 of each of supports 252 (shown in FIG. 6) move by either pivoting or sliding in α direction transverse to axis 266 into the locked state with body 250. Because heads 332 are axially movable and are resiliently biased to an extended position heads 332 may accommodate variations in vertical or X-axis positioning of wedge members 254. In other embodiments, plungers 324 may alternatively be replaced with rigid structures, such as tabs or projections, extending from lever 320 and configured to engage wedge members 254 during closing of lever 320 to the position shown in FIG. 7.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. An apparatus comprising:
   a first structure;
   a support extending from the first structure;
   a second structure
   a plurality of one of projections and detents extending along an axis and coupled to one of the first structure and the support;
   at least one of the other of the projections and detents coupled to the other of the first structure and the support, wherein the support is movable transverse to the axis between a locked position in which the projections and detents are in engagement to retain the first structure relative to the second structure along the axis and a disengaged position;
   a wedge member movable along the axis and configured to engage the support to transversely move the support from the disengaged position to the locked position.

2. The apparatus of claim 1, wherein one of the support and the wedge member has a first axial end portion including a first surface oblique to the axis and configured to engage the other of the support and the wedge member during movement of the wedge member along the axis to cause transverse movement of the support to the locked position.

3. The apparatus of claim 2, wherein the first axial end portion is conical.

4. The apparatus of claim 3, wherein the other of the support and the wedge member has a second axial end portion that is conical.

5. The apparatus of claim 1, wherein the other of the support and the wedge member has a second axial end portion including a second surface oblique to the axis and configured to engage the first surface during movement of the wedge member along the axis to facilitate transverse movement of the support towards the locked positions.

6. The apparatus of claim 2, wherein the axial end portion is tapered across an axial centerline of said one of the support and the wedge member.

7. The apparatus of claim 1, wherein said plurality of one of the projections and detents comprises one of helical threads and knurling.

8. The apparatus of claim 1, wherein the wedge member includes at least one of a projection and at least one detent configured to interlock with the other of said at least one projection and the at least one detent.

9. The apparatus of claim 1, wherein the first structure comprises a circuit board and were in the second structure comprises a heatsink.

10. The apparatus of claim 1, wherein the wedge member is resiliently biased in a direction away from the support.

11. The apparatus of claim 10 further comprising a spring captured between the wedge member and the support.

12. The apparatus of claim 1, wherein said plurality of one of the projections and detents continuously extends about the axis.

13. The apparatus of claim 1, wherein said at least one of the other of the projections and detents comprises a plurality of the other of the projections and detents continuously extending about the axis.

14. The apparatus of claim 13, wherein said at least one of the other of the projections and detents comprises one of helical threads and knurling.

15. The apparatus of claim 1, wherein the support and the wedge member are substantially identical to one another.

16. The apparatus of claim 1 further comprising a retainer configured to retain the wedge member in engagement with the support.

17. The apparatus of claim 16, wherein the retainer includes a resiliently biased plunger.

18. The apparatus of claim 1 further comprising a bore along the axis, wherein the support and the wedge member each have portions captured within the bore.

19. An apparatus comprising:
   a circuit board;
   a heat sink;
   a structure fixedly coupled to the heat sink and having a bore with internal detents and projections extending along an axis;
   a support including external first detents and projections within the bore; and
   a wedge member extending within the bore and configured to engage an axial end of the support during movement of the retainer along the axis to transversely move the external detents and projections into interlocking engagement with the internal detents and projections.

20. A method comprising:
   positioning a support extending from a first structure and having axially extending external detents and projections within a bore that is coupled to a second structure and that includes internal detents and projections; and
   urging a wedge member axially against the support to wedge the external detents and projections into locking engagement with the internal detents and projections.

* * * * *

UNITED STATES PATENT AND TRADEMARK OFFICE
CERTIFICATE OF CORRECTION

PATENT NO. : 7,397,666 B2
APPLICATION NO. : 11/552963
DATED : July 8, 2008
INVENTOR(S) : Stephan K. Barsun et al.

It is certified that error appears in the above-identified patent and that said Letters Patent is hereby corrected as shown below:

In column 1, line 20, after "illustrating" delete "the" and insert -- a --, therefor.

In column 1, line 24, delete "Figure will 1" and insert -- Fig. 1 --, therefor.

In column 1, line 64, after "component" delete "of" and insert -- or --, therefor.

In column 4, line 42, before "securing" delete "to" and insert -- in --, therefor.

In column 4, lines 53-54, delete "transverses" and insert -- transverse --, therefor.

In column 5, line 6, after "102" delete "if" and insert -- of --, therefor.

In column 5, lines 27-28, delete "releasable" and insert -- releasably --, therefor.

In column 5, line 35, delete "26. In" and insert -- 26, in --, therefor.

In column 7, line 33, delete "electron" and insert -- electronic --, therefor.

In column 8, line 36, after "planar" delete "of" and insert -- or --, therefor.

In column 8, line 39, after "movement" delete "of" and insert -- or --, therefor.

In column 8, line 47, after "are" delete "not" and insert -- out --, therefor.

In column 9, line 10, after "body" delete "259" and insert -- 250 --, therefor.

UNITED STATES PATENT AND TRADEMARK OFFICE
CERTIFICATE OF CORRECTION

PATENT NO.         : 7,397,666 B2
APPLICATION NO.    : 11/552963
DATED              : July 8, 2008
INVENTOR(S)        : Stephan K. Barsun et al.

It is certified that error appears in the above-identified patent and that said Letters Patent is hereby corrected as shown below:

In column 9, line 24, after "engagement" insert -- portion --.

In column 10, line 20, after "about" delete "about".

In column 10, line 40, after "sliding in" delete "α" and insert -- a --, therefor.

Signed and Sealed this

Seventh Day of October, 2008

JON W. DUDAS
*Director of the United States Patent and Trademark Office*